(12) United States Patent
Daimon

(10) Patent No.: US 11,251,777 B2
(45) Date of Patent: Feb. 15, 2022

(54) ACOUSTIC WAVE FILTER DEVICE AND MULTIPLEXER

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 156 days.

(21) Appl. No.: 16/813,788

(22) Filed: Mar. 10, 2020

(65) Prior Publication Data

US 2020/0212891 A1 Jul. 2, 2020

Related U.S. Application Data

(63) Continuation of application No. PCT/JP2018/034582, filed on Sep. 19, 2018.

(30) Foreign Application Priority Data

Sep. 19, 2017 (JP) .............................. JP2017-178562

(51) Int. Cl.
*H03H 9/64* (2006.01)
*H03H 9/02* (2006.01)
(Continued)

(52) U.S. Cl.
CPC ...... *H03H 9/6496* (2013.01); *H03H 9/02559* (2013.01); *H03H 9/02574* (2013.01);
(Continued)

(58) Field of Classification Search
CPC ............. H03H 9/6496; H03H 9/02574; H03H 9/14541; H03H 9/02559; H03H 9/02866;
(Continued)

(56) References Cited

U.S. PATENT DOCUMENTS

2013/0285768 A1* 10/2013 Watanabe ................ H03H 3/02
333/193
2016/0294361 A1 10/2016 Yamane et al.
(Continued)

FOREIGN PATENT DOCUMENTS

| WO | 2015/098756 A1 | 7/2015 |
| WO | 2016/208236 A1 | 12/2016 |
| WO | 2016/208446 A1 | 12/2016 |

OTHER PUBLICATIONS

Official Communication issued in International Patent Application No. PCT/JP2018/034582, dated Nov. 20, 2018.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An acoustic wave filter device includes a piezoelectric layer, a high-acoustic-velocity member, a low-acoustic-velocity film between the high-acoustic-velocity member and the piezoelectric layer, and first and second IDT electrodes on the piezoelectric layer to define acoustic wave resonators. An acoustic wave resonator of a series-arm resonator portion closest to an antenna end and/or an acoustic wave resonator of a parallel-arm resonator portion closest to the antenna end includes the first IDT electrode including first and second electrode fingers, and the remaining acoustic wave resonators include the second IDT electrode including third and fourth electrode fingers. In the first IDT electrode, a central area, first and second low-acoustic-velocity areas, and first and second high-acoustic-velocity areas extend along a direction perpendicular or substantially perpendicular to an acoustic wave propagating direction. First and second envelopes connecting the tips of the third and fourth electrode fingers of the second IDT electrode are inclined.

20 Claims, 6 Drawing Sheets

(51) Int. Cl.
  *H03H 9/145* (2006.01)
  *H03H 9/25* (2006.01)
  *H03H 9/72* (2006.01)

(52) U.S. Cl.
  CPC .... *H03H 9/02866* (2013.01); *H03H 9/02992* (2013.01); *H03H 9/1457* (2013.01); *H03H 9/14541* (2013.01); *H03H 9/14547* (2013.01); *H03H 9/25* (2013.01); *H03H 9/6483* (2013.01); *H03H 9/72* (2013.01)

(58) Field of Classification Search
  CPC ........... H03H 9/02992; H03H 9/14547; H03H 9/1457; H03H 9/25; H03H 9/6483; H03H 9/72; H03H 9/14573; H03H 9/14558; H03H 9/02858; H03H 9/02881; H03H 9/542; H03H 9/145
  USPC .......................................... 333/133, 193–196
  See application file for complete search history.

(56) References Cited

U.S. PATENT DOCUMENTS

| | | |
|---|---|---|
| 2018/0097508 A1 | 4/2018 | Iwamoto et al. |
| 2018/0102755 A1 | 4/2018 | Takamine |
| 2019/0222195 A1* | 7/2019 | Matsuda .............. H03H 9/6489 |

* cited by examiner

ACOUSTIC WAVE FILTER DEVICE AND MULTIPLEXER

CROSS REFERENCE TO RELATED APPLICATIONS

This application claims the benefit of priority to Japanese Patent Application No. 2017-178562 filed on Sep. 19, 2017 and is a Continuation Application of PCT Application No. PCT/JP2018/034582 filed on Sep. 19, 2018. The entire contents of each application are hereby incorporated herein by reference.

BACKGROUND OF THE INVENTION

1. Field of the Invention

The present invention relates to an acoustic wave filter device and a multiplexer.

2. Description of the Related Art

Acoustic wave devices have been widely used in filters of cellular phones. International Publication No. 2015/098756 discloses an example of an acoustic wave device. This acoustic wave device includes a multilayer body in which a high-acoustic-velocity film, a low-acoustic-velocity film, and a piezoelectric film are laminated in this order on a supporting substrate, and an IDT electrode provided on the piezoelectric film. Although the acoustic wave device with the above-described multilayer body may enhance the Q value, there is a problem that transverse mode ripples are generated.

In International Publication No. 2015/098756, the IDT electrode is an inclined IDT electrode in order to suppress transverse mode ripples. The inclined IDT electrode is an IDT electrode in which an envelope which is a virtual line formed by connecting the tips of a plurality of electrode fingers connected to one of two busbars and an envelope which is a virtual line formed by connecting the tips of a plurality of electrode fingers connected to the other busbar extend inclined with respect to the acoustic wave propagating direction.

However, when the IDT electrode is an inclined IDT electrode, as in International Publication No. 2015/098756, the larger the angle at which the envelopes are inclined with respect to the acoustic wave propagating direction, the greater a response (stopband response) caused at the upper end of a stopband is. Note that a stopband refers to an area where the wavelength of acoustic waves becomes constant due to the fact that the acoustic waves are confined to a metal grating with a periodical structure. In particular, because the acoustic wave device with the above-described multilayer body may efficiently confine the energy of acoustic waves to the piezoelectric film side, the stopband response becomes greater, causing a problem.

SUMMARY OF THE INVENTION

Preferred embodiments of the present invention provide acoustic wave filter devices and multiplexers that each efficiently confine the energy of acoustic waves to the piezoelectric layer side, and reduce or prevent a response caused at an upper end of a stopband.

An acoustic wave filter device according to a preferred embodiment of the present invention includes a piezoelectric layer; a high-acoustic-velocity member in which an acoustic velocity of bulk waves propagating therethrough is greater than an acoustic velocity of acoustic waves propagating through the piezoelectric layer; a low-acoustic-velocity film between the high-acoustic-velocity member and the piezoelectric layer, in which an acoustic velocity of bulk waves propagating through the low-acoustic-velocity film is less than an acoustic velocity of bulk waves propagating through the piezoelectric layer; and a plurality of IDT electrodes that are provided on the piezoelectric layer and that include a first IDT electrode and a second IDT electrode. The high-acoustic-velocity member, the low-acoustic-velocity film, the piezoelectric layer, and the plurality of IDT electrodes define a plurality of acoustic wave resonators. The plurality of acoustic wave resonators are provided in at least one series-arm resonator portion on a series arm connecting an antenna end and a signal end other than the antenna end, and in at least one parallel-arm resonator portion on a parallel arm connecting the series arm and a ground potential, and the series-arm resonator portion and the parallel-arm resonator portion each include at least one acoustic wave resonator. Of the series-arm resonator portion, at least one of the acoustic wave resonator of the series-arm resonator portion closest to the antenna end and the acoustic wave resonator of the parallel-arm resonator portion closest to the antenna end includes the first IDT electrode, and a remaining acoustic wave resonator includes the second IDT electrode. The first IDT electrode includes a first busbar and a second busbar facing each other, a plurality of first electrode fingers with first ends connected to the first busbar, and a plurality of second electrode fingers with first ends connected to the second busbar, the plurality of first electrode fingers and the plurality of second electrode fingers interdigitated with each other, and a portion in which the first electrode fingers and the second electrode fingers overlap in an acoustic wave propagating direction is a crossing area. The crossing area includes a central area positioned on a central portion in a direction orthogonal or substantially orthogonal to the acoustic wave propagating direction. A first low-acoustic-velocity area is on a first busbar side of the central area with an acoustic velocity that is less than an acoustic velocity in the central area, and a second low-acoustic-velocity area is on a second busbar side of the central area with an acoustic velocity that is less than the acoustic velocity in the central area are provided in the crossing area. In the first IDT electrode, a first high-acoustic-velocity area and a second high-acoustic-velocity area with an acoustic velocity greater than the acoustic velocity in the central area are provided, the first high-acoustic-velocity area is outside the first low-acoustic-velocity area in the direction orthogonal or substantially orthogonal to the acoustic wave propagating direction, and the second high-acoustic-velocity area is outside the second low-acoustic-velocity area in the direction orthogonal or substantially orthogonal to the acoustic wave propagating direction. The second IDT electrode includes a plurality of third electrode fingers and a plurality of fourth electrode fingers interdigitated with each other. A first envelope which is a virtual line connecting tips of the plurality of third electrode fingers is inclined with respect to the acoustic wave propagating direction, and a second envelope which is a virtual line connecting tips of the plurality of fourth electrode fingers is inclined with respect to the acoustic wave propagating direction.

In an acoustic wave filter device according to a preferred embodiment of the present invention, both of the acoustic wave resonator of the series-arm resonator portion closest to the antenna end and the acoustic wave resonator of the parallel-arm resonator portion closest to the antenna end include the first IDT electrode. In this case, a response occurring at the upper end of a stopband is further reduced or prevented.

In an acoustic wave filter device according to a preferred embodiment of the present invention, the high-acoustic-velocity member is a supporting substrate.

In an acoustic wave filter device according to a preferred embodiment of the present invention, the high-acoustic-velocity member is a high-acoustic-velocity film, a supporting substrate is further provided, and the high-acoustic-velocity film is provided between the supporting substrate and the low-acoustic-velocity film.

In an acoustic wave filter device according to a preferred embodiment of the present invention, the acoustic wave filter device is a ladder-type filter including a plurality of the series-arm resonator portions and a plurality of the parallel-arm resonator portions.

A multiplexer according to a preferred embodiment of the present invention includes an antenna terminal connected to an antenna; an acoustic wave filter device according to a preferred embodiment of the present invention, the acoustic wave filter device being connected to the antenna terminal; and at least one band-pass filter that is commonly connected to the antenna terminal along with the acoustic wave filter device, and that has a passband different from the acoustic wave filter device.

According to preferred embodiments of the present invention, acoustic wave filter devices and multiplexers that efficiently confine the energy of acoustic waves to the piezoelectric layer side and reduce or prevent a response caused at the upper end of a stopband are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

Note that preferred embodiments described in the present specification are exemplary and a partial replacement or combination of configurations in different preferred embodiments is possible.

Figure 1:
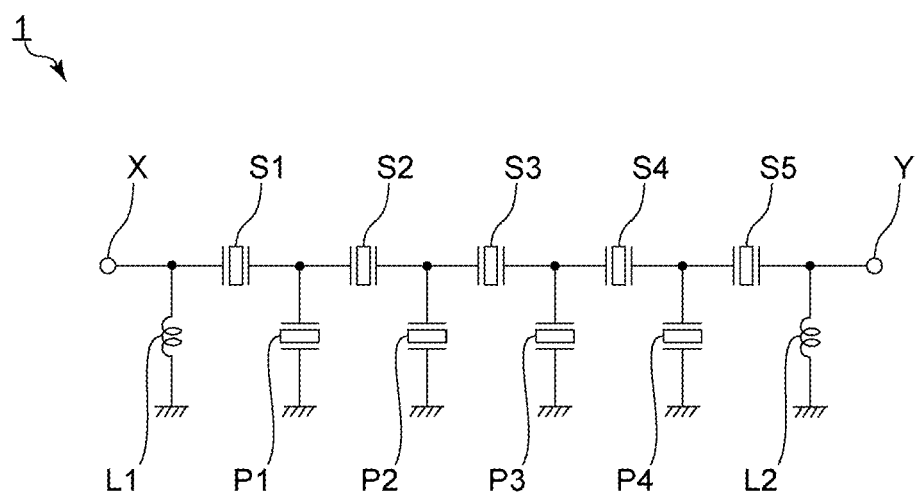
FIG. 1 is a circuit diagram of an acoustic wave filter device according to a first preferred embodiment of the present invention.

FIG. 1 is a circuit diagram of an acoustic wave filter device according to a first preferred embodiment of the present invention.

An acoustic wave filter device 1 of the present preferred embodiment is a ladder filter including a plurality of series-arm resonator portions and a plurality of parallel-arm resonator portions. The plurality of series-arm resonator portions and the plurality of parallel-arm resonator portions each include an acoustic wave resonator.

On a series arm connecting an antenna end X and a signal end Y, a series-arm resonator portion S1, a series-arm resonator portion S2, a series-arm resonator portion S3, a series-arm resonator portion S4, and a series-arm resonator portion S5 are provided. A series-arm resonator portion closest to the antenna end X is the series-arm resonator portion S1.

A plurality of parallel-arm resonator portions are provided respectively on parallel arms connecting the series arm and a ground potential. More specifically, a parallel-arm resonator portion P1 is connected between a node between the series-arm resonator portion S1 and the series-arm resonator portion S2 and the ground potential. A parallel-arm resonator portion P2 is connected between a node between the series-arm resonator portion S2 and the series-arm resonator portion S3 and the ground potential. A parallel-arm resonator portion P3 is connected between a node between the series-arm resonator portion S3 and the series-arm resonator portion S4 and the ground potential. A parallel-arm resonator portion P4 is connected between a node between the series-arm resonator portion S4 and the series-arm resonator portion S5 and the ground potential. A parallel-arm resonator portion closest to the antenna end X is the parallel-arm resonator portion P1.

The series-arm resonator portions S1 to S5 and the parallel-arm resonator portions P1 to P4 are each defined by one acoustic wave resonator. Note that a series-arm resonator portion may be defined by a plurality of acoustic wave resonators connected in series. In the case where a series-arm resonator portion is defined by a plurality of acoustic wave resonators, the plurality of acoustic wave resonators may be series-divided acoustic wave resonators. In addition, a parallel-arm resonator portion may be defined by a plurality of acoustic wave resonators connected in parallel. In the case where a parallel-arm resonator portion is defined by a plurality of acoustic wave resonators, the plurality of acoustic wave resonators may be parallel-divided acoustic wave resonators.

An inductor L1 is connected between a node between the antenna end X and the series-arm resonator portion S1 and the ground potential. An inductor L2 is connected between a node between the series-arm resonator portion S5 and the signal end Y and the ground potential. The inductor L1 and the inductor L2 provide impedance adjustment. Note that the inductor L1 and the inductor L2 need not be provided.

Hereinafter, a specific configuration of an acoustic wave resonator will be described.

Figure 2:
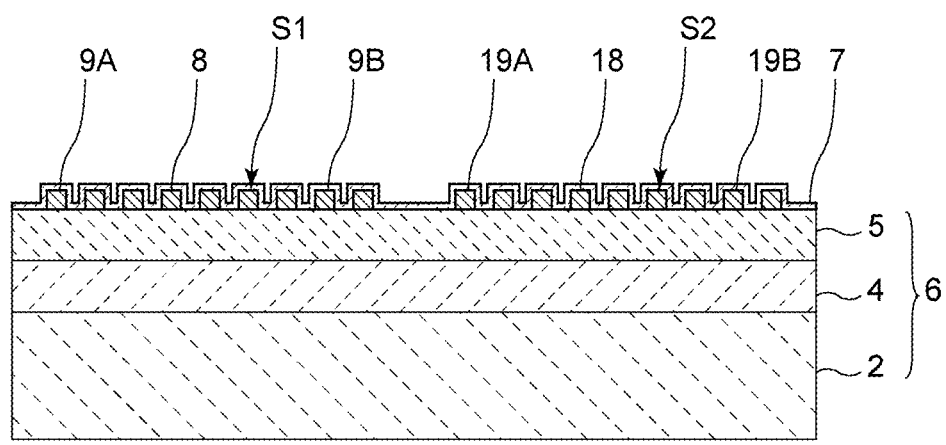
FIG. 2 is a schematic elevational cross-sectional view illustrating a series-arm resonator portion closest to an antenna end, and another series-arm resonator portion, which are schematically arranged side by side, in the first preferred embodiment of the present invention.

FIG. 2 is a schematic elevational cross-sectional view illustrating a series-arm resonator portion closest to an antenna end, and another series-arm resonator portion, which are schematically arranged side by side, in the first preferred embodiment.

The series-arm resonator portion S1 and the series-arm resonator portion S2 include a supporting substrate 2. A low-acoustic-velocity film 4 is provided on the supporting substrate 2. A piezoelectric layer 5 is provided on the low-acoustic-velocity film 4. Here, the low-acoustic-velocity film 4 is a film in which the acoustic velocity of bulk waves propagating therethrough is less than the acoustic velocity of bulk waves propagating through the piezoelectric layer 5.

The piezoelectric layer 5 is preferably made of, for example, 50° Y-cut angle LiTaO₃ in the present preferred embodiment. Note that the cut angle of the piezoelectric layer 5 is not limited to the above. The piezoelectric layer 5 may be made of a piezoelectric single crystal other than LiTaO₃, such as LiNbO₃, or of appropriate piezoelectric ceramics, for example.

The low-acoustic-velocity film 4 is preferably made of, for example, silicon oxide in the present preferred embodiment. More specifically, silicon oxide is represented by $SiO_x$, and the low-acoustic-velocity film 4 is preferably made of $SiO_2$, for example. Note that the low-acoustic-velocity film 4 may be made of silicon oxide in which x is a numeral other than 2. Alternatively, the low-acoustic-velocity film 4 may be made of, for example, a material whose main component is a compound obtained by adding fluorine, carbon, or boron to glass, silicon oxynitride, tantalum oxide, or silicon oxide. It is only necessary that the material of the low-acoustic-velocity film 4 is a relatively low-acoustic-velocity material.

In the present preferred embodiment, the supporting substrate 2 is preferably made of a high-acoustic-velocity material in which the acoustic velocity of bulk waves propagating therethrough is greater than the acoustic velocity of acoustic waves propagating through the piezoelectric layer 5. More specifically, the supporting substrate 2 is preferably made of Si, for example. Note that the high-acoustic-velocity material defining the supporting substrate 2 may be a material whose main component is, for example, aluminum nitride, aluminum oxide, silicon carbide, silicon oxynitride, DLC film, or diamond, for example. Note that it is only necessary that the high-acoustic-velocity material be a relatively high-acoustic-velocity material.

As described above, the acoustic wave filter device 1 includes a multilayer body 6 in which the supporting substrate 2 made of a high-acoustic-velocity member, the low-acoustic-velocity film 4, and the piezoelectric layer 5 are laminated in this order. A plurality of acoustic wave resonators other than the series-arm resonator portion S1 and the series-arm resonator portion S2 of the acoustic wave filter device 1 are also provided on the piezoelectric layer 5.

A plurality of IDT electrodes including a first IDT electrode 8 and a second IDT electrode 18 are provided on the piezoelectric layer 5. Acoustic waves are excited in response to application of an alternating-current (AC) voltage to an IDT electrode. The first IDT electrode 8 and the second IDT electrode 18 are preferably made of, for example, a laminated metal film obtained by laminating an AlCu layer on a Ti layer. The AlCu layer according to the present preferred embodiment is preferably made of, for example, an alloy including about 1% by mass of Cu in Al. Note that the material of the first IDT electrode 8 and the second IDT electrode 18 is not limited to the above. The first IDT electrode 8 and the second IDT electrode 18 may be made of a single-layer metal film.

As illustrated in FIG. 2, the series-arm resonator portion S1 includes the first IDT electrode 8. The series-arm resonator portion S1 includes a reflector 9A and a reflector 9B, which are arranged on both sides in the acoustic wave propagating direction of the first IDT electrode 8. The series-arm resonator portion S1 is an acoustic wave resonator that uses piston mode, which will be described in detail later. The parallel-arm resonator portion P1, which is illustrated in FIG. 1 and which is closest to the antenna end X, is also an acoustic wave resonator that uses piston mode, which has the same or similar configuration as that of the series-arm resonator portion S1. Note that the series-arm resonator portion S1 and the parallel-arm resonator portion P1 may have different design parameters according to desired filter characteristics.

In contrast, the series-arm resonator portion S2 includes the second IDT electrode 18, and a reflector 19A and a reflector 19B, which are arranged on both sides in the acoustic wave propagating direction of the second IDT electrode 18. The second IDT electrode 18 is an inclined IDT electrode, which will be described in detail later. A plurality of acoustic wave resonators other than the series-arm resonator portion S1 and the parallel-arm resonator portion P1 illustrated in FIG. 1 have the same or similar configuration as that of the series-arm resonator portion S2. More specifically, the series-arm resonator portion S3, the series-arm resonator portion S4, the series-arm resonator portion S5, the parallel-arm resonator portion P2, the parallel-arm resonator portion P3, and the parallel-arm resonator portion P4 each include the second IDT electrode 18, the reflector 19A, and the reflector 19B. Note that each acoustic wave resonator other than the series-arm resonator portion S1 and the parallel-arm resonator portion P1 may have different design parameters according to desired filter characteristics.

In the present preferred embodiment, the reflector 9A and the reflector 9B of the series-arm resonator portion S1 and the parallel-arm resonator portion P1 are preferably made of the same or similar material as the first IDT electrode 8. The reflector 19A and the reflector 19B of a plurality of acoustic wave resonators other than the series-arm resonator portion S1 and the parallel-arm resonator portion P1 are preferably made of the same or similar material as the second IDT electrode 18.

As illustrated in FIG. 2, a protective film 7 is provided on the piezoelectric layer 5 so as to cover the first IDT electrode 8, the second IDT electrode 18, the reflector 9A, the reflector 9B, the reflector 19A, and the reflector 19B. The protective film 7 is preferably made of, for example, $SiO_2$ in the present preferred embodiment, although this is not particularly limited.

The advantageous effects of the present preferred embodiment are a result of the following configuration. 1) The configuration includes the above-described multilayer body 6. 2) An acoustic wave resonator defining the series-arm resonator portion S1 closest to the antenna end X, and an acoustic wave resonator defining the parallel-arm resonator portion P1 closest to the antenna end X, which are illustrated in FIG. 1, are acoustic wave resonators using piston mode. 3) The other acoustic wave resonators include the inclined second IDT electrode 18. Because the configuration includes the multilayer body 6 in which the supporting substrate 2 made of a high-acoustic-velocity member, the low-acoustic-velocity film 4, and the piezoelectric layer 5 are laminated in this order, the energy of acoustic waves is efficiently confined to the piezoelectric layer 5 side. In addition, because the series-arm resonator portion S1 and the parallel-arm resonator portion P1 are acoustic wave resonators using piston mode and the other acoustic wave resonators include the inclined second IDT electrode 18, a response caused at the upper end of a stopband can be effectively reduced or prevented. Hereinafter, along with the specific configuration of the first IDT electrode 8 and the second IDT electrode 18, the advantageous effects of reducing or preventing a response caused at the upper end of a stopband will be described in detail. Note that a response caused at the upper end of a stopband is referred to as a stopband response in the present specification.

Figure 3:
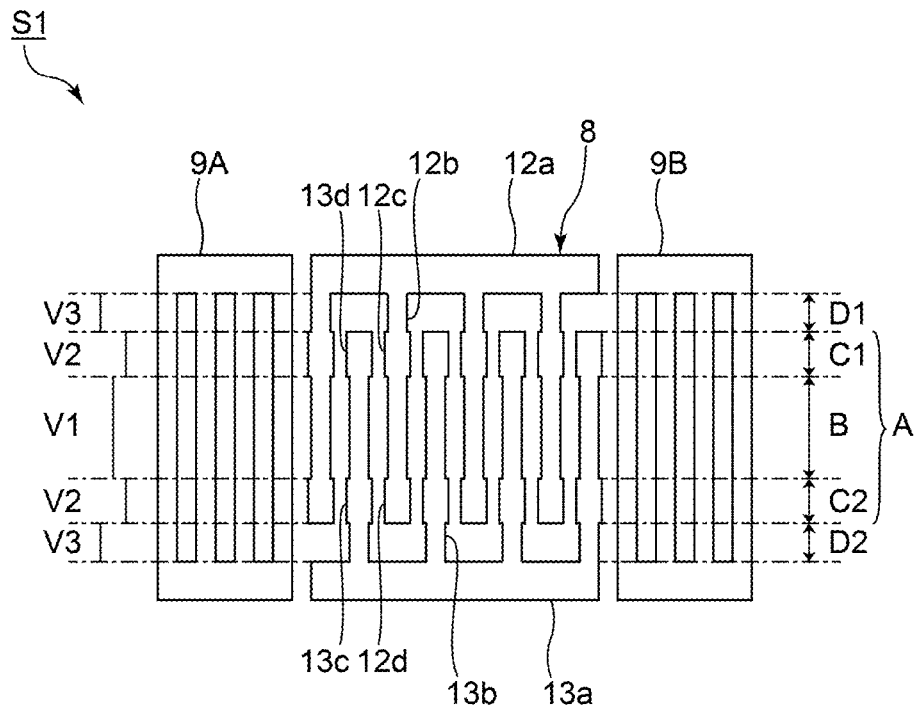
FIG. 3 is a schematic plan view illustrating the electrode structure of the series-arm resonator portion closest to the antenna end in the first preferred embodiment of the present invention.

FIG. 3 is a schematic plan view illustrating the electrode structure of a series-arm resonator portion closest the antenna end in the first preferred embodiment.

The first IDT electrode 8 includes a first busbar 12a and a second busbar 13a facing each other. The first IDT electrode 8 includes a plurality of first electrode fingers 12b whose first ends are connected to the first busbar 12a. The first IDT electrode 8 further includes a plurality of second electrode fingers 13b whose first ends are connected to the second busbar 13a. The plurality of first electrode fingers 12b and the plurality of second electrode fingers 13b are interdigitated with each other.

In the first IDT electrode 8, a portion where the first electrode fingers 12b and the second electrode fingers 13b overlap each other in the acoustic wave propagating direction is a crossing area A. The crossing area A includes a central area B positioned on the central portion in a direction orthogonal or substantially orthogonal to the acoustic wave propagating direction.

The crossing area A includes a first edge area C1, which is on the first busbar 12a side of the central area B, and a second edge area C2, which is on the second busbar 13a side of the central area B. The plurality of first electrode fingers 12b include a wide portion 12c and a wide portion 12d, which are wider than other portions, in the first edge area C1 and the second edge area C2. Similarly, the plurality of second electrode fingers 13b include a wide portion 13d and a wide portion 13c, which are wider than other portions, in the first edge area C1 and the second edge area C2. In the present preferred embodiment, because the first electrode fingers 12b and the second electrode fingers 13b include the wide portion 12c and the wide portion 13d, a first low-acoustic-velocity area in which the acoustic velocity is less than the acoustic velocity in the central area B is provided in the first edge area C1. Similarly, because the first electrode fingers 12b and the second electrode fingers 13b include the wide portion 12d and the wide portion 13c, a second low-acoustic-velocity area in which the acoustic velocity is less than the acoustic velocity in the central area B is provided in the second edge area C2. Here, V2<V1 where V1 is the acoustic velocity in the central area B, and V2 is the acoustic velocity in the first low-acoustic-velocity area and the second low-acoustic-velocity area.

Note that the first low-acoustic-velocity area and the second low-acoustic-velocity area may be provided by a mass additional film on the first electrode fingers 12b and the second electrode fingers 13b in the first edge area C1 and the second edge area C2. Alternatively, the first low-acoustic-velocity area and the second low-acoustic-velocity area may be provided by the wide portion 12c, the wide portion 12d, the wide portion 13c, and the wide portion 13d and providing the mass additional film.

The first IDT electrode 8 includes a first outer area D1, which is outside the first edge area C1 in a direction orthogonal or substantially orthogonal to the acoustic wave propagating direction. The first IDT electrode 8 further includes a second outer area D2, which is outside the second edge area C2 in a direction orthogonal or substantially orthogonal to the acoustic wave propagating direction. In the present preferred embodiment, the first outer area D1 is positioned between the first edge area C1 and the first busbar 12a. The second outer area D2 is positioned between the second edge area C2 and the second busbar 13a.

In the first outer area D1, only the first electrode fingers 12b, of the first electrode fingers 12b and the second electrode fingers 13b, are provided. In the second outer area D2, only the second electrode fingers 13b, of the first electrode fingers 12b and the second electrode fingers 13b, are provided. Accordingly, the acoustic velocity in the first outer area D1 and the second outer area D2 is greater than the acoustic velocity in the central area B. V1<V3 where V3 is the acoustic velocity of acoustic waves in the first outer area D1 and the second outer area D2. As described above, a first high-acoustic-velocity area is provided in the first outer area D1, and a second high-acoustic-velocity area is provided in the second outer area D2.

The relationship among the acoustic velocities is preferably: V2<V1<V3. The above-described acoustic velocity relationship is illustrated in FIG. 3. Note that it is indicated that the acoustic velocity becomes greater toward the left side in FIG. 3.

In the first IDT electrode 8, the first low-acoustic-velocity area and the second low-acoustic-velocity area are outside the central area B in a direction orthogonal or substantially orthogonal to the acoustic wave propagating direction. The first high-acoustic-velocity area and the second high-acoustic-velocity area are outside the first low-acoustic-velocity area and the second low-acoustic-velocity area in a direction orthogonal or substantially orthogonal to the acoustic wave propagating direction. As described above, the series-arm resonator portion S1 uses piston mode, thus reducing or preventing transverse mode spurious emission and a stopband response.

Figure 4:
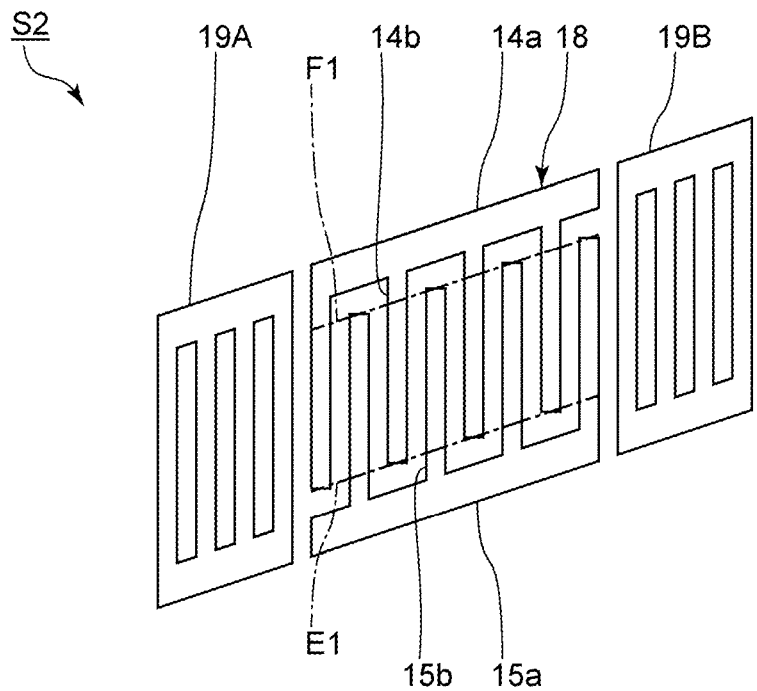
FIG. 4 is a schematic plan view illustrating the electrode structure of a series-arm resonator portion including a second IDT electrode in the first preferred embodiment of the present invention.

FIG. 4 is a schematic plan view illustrating the electrode structure of a series-arm resonator portion with a second IDT electrode in the first preferred embodiment.

The second IDT electrode 18 includes a third busbar 14a and a fourth busbar 15a facing each other. The second IDT electrode 18 includes a plurality of third electrode fingers 14b whose first ends are connected to the third busbar 14a. The second IDT electrode 18 further includes a plurality of fourth electrode fingers 15b whose first ends are connected to the fourth busbar 15a. The plurality of third electrode fingers 14b and the plurality of fourth electrode fingers 15b are interdigitated with each other.

A first envelope E1, which is a virtual line connecting the tips of the plurality of third electrode fingers 14b, extends inclined with respect to the acoustic wave propagating direction. Similarly, a second envelope F1, which is a virtual line connecting the tips of the plurality of fourth electrode fingers 15b, extends inclined with respect to the acoustic wave propagating direction. Accordingly, a stopband response can be reduced or prevented in the series-arm resonator portion S2. The second IDT electrode 18 is an inclined IDT electrode in which the first envelope E1 and the second envelope F1 extend inclined with respect to the acoustic wave propagating direction. Although an inclination angle which is the angle at which the first envelope E1 and the second envelope F1 extend inclined with respect to the acoustic wave propagating direction is not particularly limited, the inclination angle is preferably about 5°, for example, in the present preferred embodiment.

Here, the configuration of the acoustic wave filter device 1 of the first preferred embodiment is as below.

First IDT electrode and second IDT electrode: thickness of Ti layer is 2 nm, and thickness of AlCu layer is about 162 nm;

Piezoelectric layer: material is LiTaO$_3$, cut angle is about 50°, and thickness is about 600 nm;

Low-acoustic-velocity film: material is SiO$_2$, and thickness is about 670 nm;

Supporting substrate: material is Si, and thickness is about 200 μm; and

Protective film: material is SiO$_2$, and thickness is about 25 nm.

In the inclined IDT electrode, the stopband response becomes smaller as the inclination angle becomes smaller. However, transverse mode spurious emission is caused when the inclination angle is small. In the present preferred embodiment, the series-arm resonator portion S1 and the parallel-arm resonator portion P1 closest to the antenna end X, which are illustrated in FIG. 1, are acoustic wave resonators using piston mode, and the IDT electrodes of the other acoustic wave resonators are inclined IDT electrodes. Accordingly, transverse mode spurious emission can be effectively reduced or prevented, and a stopband response can be effectively reduced or prevented. This will be described hereinafter using FIGS. 5 to 8.

Figure 5:
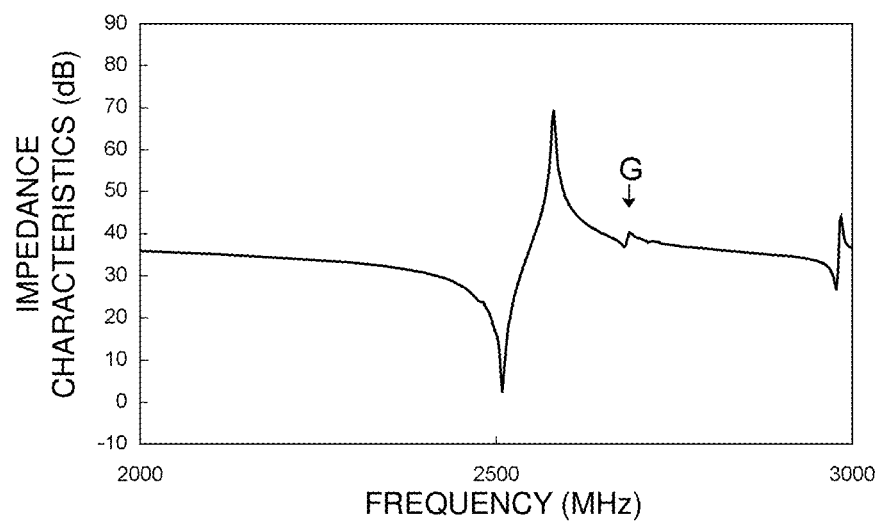
FIG. 5 is a diagram illustrating the impedance characteristics of an acoustic wave resonator including an inclined IDT electrode in the first preferred embodiment of the present invention.
Figure 6:
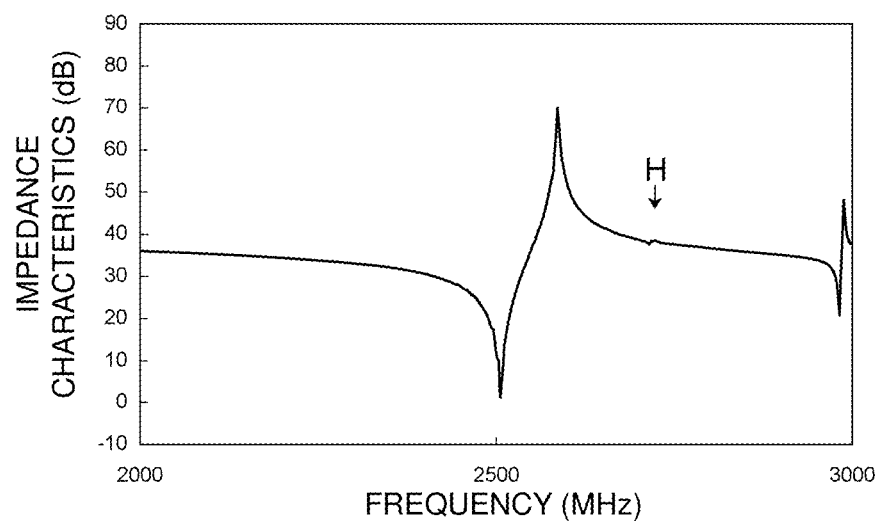
FIG. 6 is a diagram illustrating the impedance characteristics of an acoustic wave resonator using piston mode in the first preferred embodiment of the present invention.

FIG. 5 is a diagram illustrating the impedance characteristics of an acoustic wave resonator with an inclined IDT electrode in the first preferred embodiment. FIG. 6 is a diagram illustrating the impedance characteristics of an acoustic wave resonator using piston mode in the first preferred embodiment.

As indicated by arrow G in FIG. 5, a stopband response occurs in an acoustic wave resonator with a second IDT electrode which is an inclined IDT electrode. In contrast, as illustrated in FIG. 6, a stopband response is reduced or prevented in an acoustic wave resonator using piston mode, as indicated by arrow H.

Figure 7:
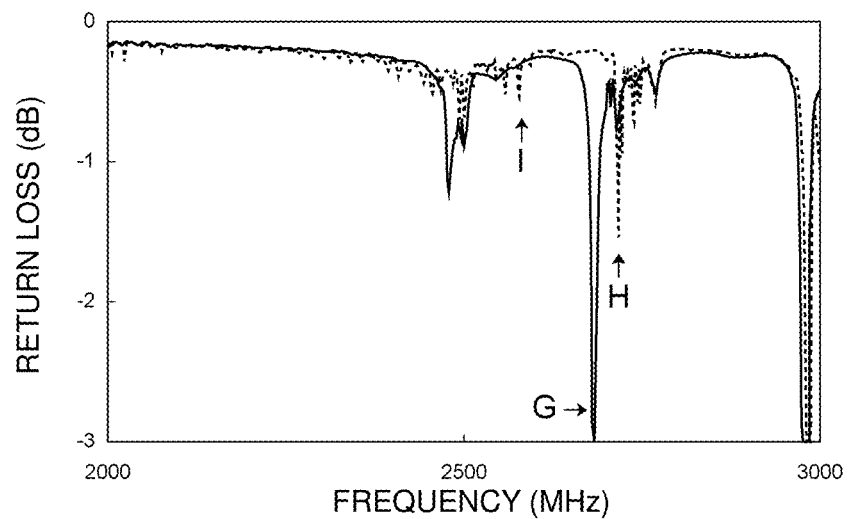
FIG. 7 is a diagram illustrating the return loss of the acoustic wave resonator with the inclined IDT electrode and the acoustic wave resonator using piston mode, which are in the first preferred embodiment of the present invention.

FIG. 7 is a diagram illustrating the return loss of the acoustic wave resonator including the inclined IDT electrode and the acoustic wave resonator using piston mode, which are in the first preferred embodiment. In FIG. 7, a solid line indicates the result of the acoustic wave resonator including the inclined IDT electrode, and a broken line indicates the result of the acoustic wave resonator using piston mode.

As indicated by arrow G and arrow H in FIG. 7, a stopband response is reduced or prevented in the acoustic wave resonator using piston mode, as in the results illustrated in FIGS. 5 and 6. In contrast, as indicated by arrow I in FIG. 7, transverse mode spurious emission is sufficiently reduced or prevented in the acoustic wave resonator using piston mode. Furthermore, transverse mode spurious emission is further reduced or prevented in the inclined IDT electrode.

Figure 8:
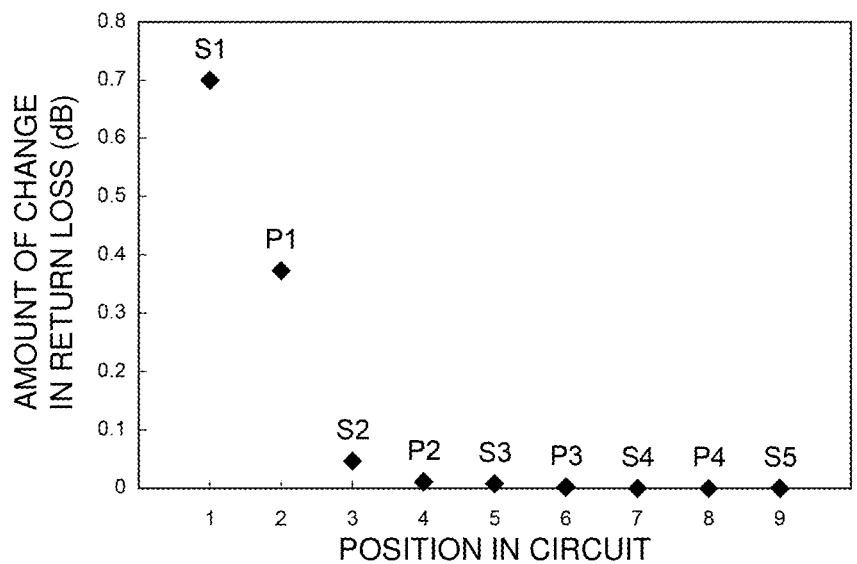
FIG. 8 is a diagram illustrating the relationship between the position and the amount of change in return loss of acoustic wave resonators in a circuit in the first preferred embodiment of the present invention.

Here, the amount of change in return loss of each acoustic wave resonator in the acoustic wave filter device 1, as viewed from the antenna end side, is illustrated in FIG. 8 described hereinafter. Note that the amount of change in return loss is the difference between the return loss of each acoustic wave resonator illustrated in FIG. 1 and the return loss of the series-arm resonator portion S5. FIG. 8 illustrates the amount of change in return loss of each acoustic wave resonator at about 4000 MHz.

FIG. 8 is a diagram illustrating the relationship between the position and the amount of change in return loss of each acoustic wave resonator in a circuit in the first preferred embodiment. The horizontal axis in FIG. 8 indicates acoustic wave resonators whose positions are indicated by, from the left side, numbers that are in the order of closeness to the antenna end. Symbols in FIG. 8 correspond to symbols of the series-arm resonator portions and the parallel-arm resonator portions illustrated in FIG. 1.

As illustrated in FIG. 8, it is clear that the amounts of change in return loss of the series-arm resonator portion S1 closest to the antenna end and the parallel-arm resonator portion P1 closest to the antenna end are much greater than the amounts of change in return loss of the other acoustic wave resonators. The amount of change in return loss decreases as the distance from the antenna end increases. In the present preferred embodiment, the series-arm resonator portion S1 and the parallel-arm resonator portion P1 whose amounts of change in return loss are great are acoustic wave resonators using piston mode that are capable of further reducing or preventing a stopband response. Therefore, a stopband response may be more effectively reduced or prevented in the acoustic wave filter device 1.

Furthermore, the series-arm resonator portion S1 and the parallel-arm resonator portion P1 may sufficiently reduce or prevent transverse mode spurious emission, and the other acoustic wave resonators are acoustic wave resonators that are capable of further reducing or preventing the spurious emission and that include an inclined second IDT electrode. Accordingly, transverse mode spurious emission can be effectively reduced or prevented.

It is preferable that the inclination angle of the second IDT electrode, which is an inclined IDT electrode, is greater than or equal to about 0.4° and less than or equal to about 15°, for example. By setting the inclination angle of the second IDT electrode to the above range, the influence of transverse mode spurious emission can be reduced or prevented in the acoustic wave filter device 1.

Note that it is only necessary for at least one of the acoustic wave resonator of the series-arm resonator portion S1 closest to the antenna end and the acoustic wave resonator of the parallel-arm resonator portion P1 closest to the antenna end to include the first IDT electrode 8 illustrated in FIG. 2. In this case, because at least one of the acoustic wave resonators with a great amount of change in return loss is an acoustic wave resonator using piston mode, a stopband response may be effectively reduced or prevented. In addition, because the configuration includes the multilayer body 6, the energy of acoustic waves may be efficiently confined to the piezoelectric layer 5 side.

Here, in the case where the acoustic wave resonator of a series-arm resonator portion closest to the antenna end includes a plurality of acoustic wave resonators, a stopband response may be effectively reduced or prevented because all of the acoustic wave resonators of this series-arm resonator portion include the first IDT electrode 8. In the case where a plurality of acoustic wave resonators are provided in a parallel-arm resonator portion closest to the antenna end, a stopband response may be effectively reduced or prevented because all of the acoustic wave resonators of the parallel-arm resonator portion include the first IDT electrode 8.

As in the present preferred embodiment illustrated in FIG. 1, in the case where a series-arm resonator portion is arranged closer to the antenna end X than a parallel arm, it is only necessary for the configuration to include a plurality of series-arm resonator portions. In this case, it is only necessary for at least the acoustic wave resonator of a series-arm resonator portion that is not closest to the antenna end X to include the second IDT electrode. In contrast, in the case where a parallel arm is arranged closer to the antenna end X than a series-arm resonator portion, it is only necessary for the configuration to include a plurality of parallel arms where parallel-arm resonator portions are arranged. In this case, it is only necessary for at least the acoustic wave resonator of a parallel-arm resonator portion that is not closest to the antenna end X to include the second IDT electrode.

An IDT electrode illustrated in FIG. 9 described below may be used as the second IDT electrode.

Figure 9:
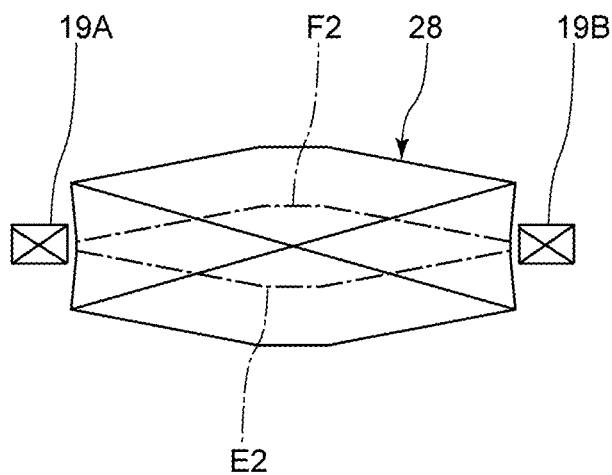
FIG. 9 is a schematic plan view illustrating the electrode structure of a series-arm resonator portion other than the series-arm resonator portion closest to the antenna end in a modification of the first preferred embodiment of the present invention.

FIG. 9 is a schematic plan view illustrating the electrode structure of a series-arm resonator portion other than the series-arm resonator portion closest to the antenna end in a modification of the first preferred embodiment. In FIG. 9, a second IDT electrode and reflectors are illustrated by a schematic drawing in which two diagonals are added to polygons.

The planar shape of a second IDT electrode 28 in the present modification is rhombic or substantially rhombic. A first envelope E2 and a second envelope F2 in the second IDT electrode 28 include a portion extending inclined with respect to the acoustic wave propagating direction and a portion extending parallel or substantially parallel in the acoustic wave propagating direction. As described above, directions in which the first envelope E2 and the second envelope F2 extend may change.

Figure 10:
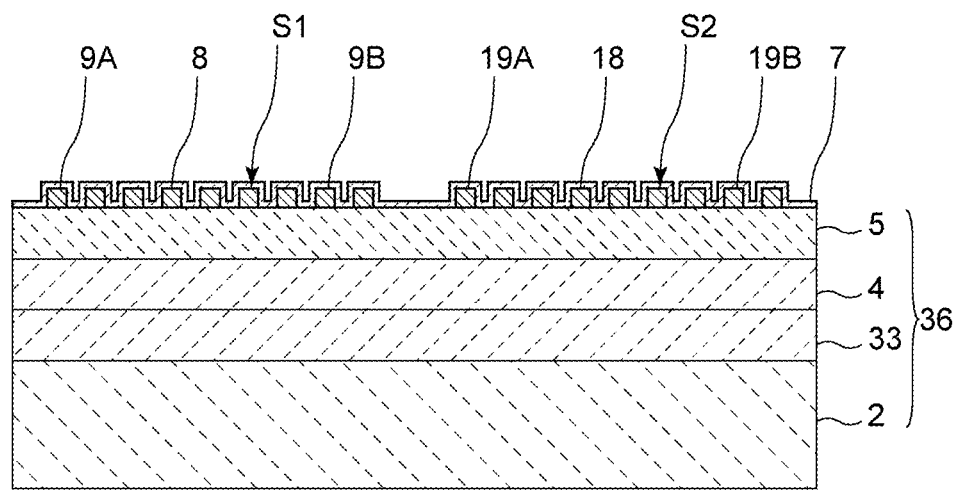
FIG. 10 is a schematic elevational cross-sectional view illustrating a series-arm resonator portion closest to an antenna end, and another series-arm resonator portion, which are schematically arranged side by side, in a second preferred embodiment of the present invention.

FIG. 10 is a schematic elevational cross-sectional view illustrating a series-arm resonator portion closest to an antenna end, and another series-arm resonator portion, which are schematically arranged side by side, in a second preferred embodiment of the present invention.

The present preferred embodiment is different from the first preferred embodiment in that the high-acoustic-velocity member in a multilayer body 36 is a high-acoustic-velocity film 33. The high-acoustic-velocity film 33 is provided between the supporting substrate 2 and the low-acoustic-velocity film 4. The high-acoustic-velocity film 33 is preferably made of the same or similar high-acoustic-velocity material as that of the supporting substrate 2 in the first preferred embodiment. The acoustic wave filter device of the present preferred embodiment has the same or substantially the same configuration as that of the acoustic wave filter device 1 of the first preferred embodiment except for the above point. Note that a material defining the supporting substrate 2 is not limited to the high-acoustic-velocity material in the present preferred embodiment.

Even in the present preferred embodiment, the series-arm resonator portion S1 closest to the antenna end and a parallel-arm resonator portion closest to the antenna end are acoustic wave resonators using piston mode. The remaining acoustic wave resonators are acoustic wave resonators including an inclined IDT electrode. Furthermore, the acoustic wave filter device of the present preferred embodiment includes the multilayer body 36. Therefore, like the first preferred embodiment, the energy of acoustic waves can be efficiently confined to the piezoelectric layer 5 side, and a stopband response can be effectively reduced or prevented in the present preferred embodiment.

Figure 11:
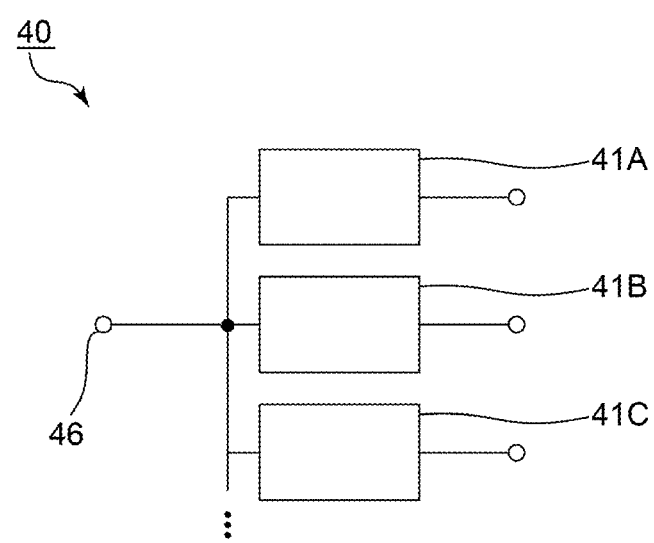
FIG. 11 is a schematic diagram of a multiplexer according to a third preferred embodiment of the present invention.

FIG. 11 is a schematic diagram of a multiplexer according to a third preferred embodiment of the present invention.

A multiplexer 40 includes an antenna terminal 46 connected to an antenna. The multiplexer 40 includes a first band-pass filter 41A, a second band-pass filter 41B, and a third band-pass filter 41C, which are commonly connected to the antenna terminal 46. The first band-pass filter 41A has the same or substantially the same configuration as that of the acoustic wave filter device 1 of the first preferred embodiment. The first band-pass filter 41A, the second band-pass filter 41B, and the third band-pass filter 41C have different passbands.

Note that the multiplexer 40 also includes one or more filter devices that are other than the first band-pass filter 41A, the second band-pass filter 41B, and the third band-pass filter 41C, and that are commonly connected to the antenna terminal 46. The number of filter devices included in the multiplexer 40 is not particularly limited. It is only necessary for the multiplexer 40 to include the first band-pass filter 41A and at least one band-pass filter whose passband is different from that of the first band-pass filter 41A.

In the first band-pass filter 41A of the multiplexer 40, as in the first preferred embodiment, the energy of acoustic waves can be efficiently confined to the piezoelectric layer side, and a stopband response can be effectively reduced or prevented. Note that transverse mode spurious emission can also be reduced or prevented in the first band-pass filter 41A. Accordingly, the influence of a stopband response and transverse mode spurious emission in the first band-pass filter 41A on the second band-pass filter 41B and the third band-pass filter 41C can be effectively reduced or prevented. Therefore, in the multiplexer 40, the filter characteristics of the second band-pass filter 41B and the third band-pass filter 41C, which are commonly connected to the antenna terminal 46 along with the first band-pass filter 41A, can be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   a piezoelectric layer;
   a high-acoustic-velocity member in which an acoustic velocity of bulk waves propagating therethrough is greater than an acoustic velocity of acoustic waves propagating through the piezoelectric layer; and
   a plurality of IDT electrodes on the piezoelectric layer and including a first IDT electrode and a second IDT electrode; wherein the high-acoustic-velocity member, the piezoelectric layer, and the plurality of IDT electrodes define a plurality of acoustic wave resonators;

the plurality of acoustic wave resonators are provided in at least one series-arm resonator portion on a series arm connecting an antenna end and a signal end other than the antenna end, and in at least one parallel-arm resonator portion that is provided on a parallel arm connecting the series arm and a ground potential, and the series-arm resonator portion and the parallel arm resonator portion each include at least one acoustic wave resonator;

at least one of the acoustic wave resonator of the series-arm resonator portion closest to the antenna end and the acoustic wave resonator of the parallel-arm resonator portion closest to the antenna end includes the first IDT electrode, and at least one acoustic wave resonator among one or more remaining acoustic wave resonators of the plurality of acoustic wave resonators includes the second IDT electrode;

the first IDT electrode includes a first busbar and a second busbar facing each other, a plurality of first electrode fingers including first ends connected to the first busbar, and a plurality of second electrode fingers including first ends connected to the second busbar, the plurality of first electrode fingers and the plurality of second electrode fingers are interdigitated with each other, and a portion in which the first electrode fingers and the second electrode fingers overlap in an acoustic wave propagating direction is a crossing area;

the crossing area includes a central area at a central portion in a direction orthogonal or substantially orthogonal to the acoustic wave propagating direction;

a first low-acoustic-velocity area on a first busbar side of the central area and having an acoustic velocity less than an acoustic velocity in the central area, and a second low-acoustic-velocity area on a second busbar side of the central area and having an acoustic velocity less than the acoustic velocity in the central area are provided in the crossing area;

in the first IDT electrode, a first high-acoustic-velocity area and a second high-acoustic-velocity area having an acoustic velocity greater than the acoustic velocity in the central area are provided, the first high-acoustic-velocity area is outside the first low-acoustic-velocity area in the direction orthogonal or substantially orthogonal to the acoustic wave propagating direction, and the second high-acoustic-velocity area is outside the second low-acoustic-velocity area in the direction orthogonal or substantially orthogonal to the acoustic wave propagating direction;

the second IDT electrode includes a plurality of third electrode fingers and a plurality of fourth electrode fingers interdigitated with each other; and a first envelope which is a virtual line connecting tips of the plurality of third electrode fingers is inclined with respect to the acoustic wave propagating direction, and a second envelope which is a virtual line connecting tips of the plurality of fourth electrode fingers is inclined with respect to the acoustic wave propagating direction.

2. The acoustic wave filter device according to claim 1, wherein both of the acoustic wave resonator of the series-arm resonator portion closest to the antenna end and the acoustic wave resonator of the parallel-arm resonator portion closest to the antenna end include the first IDT electrode.

3. The acoustic wave filter device according to claim 1, wherein the high-acoustic-velocity member is a supporting substrate.

4. The acoustic wave filter device according to claim 1, wherein
the high-acoustic-velocity member is a high-acoustic-velocity film; and
a supporting substrate is arranged such that the high-acoustic-velocity film is between the supporting substrate and the piezoelectric layer.

5. The acoustic wave filter device according to claim 1, wherein the acoustic wave filter device is a ladder filter including a plurality of the series-arm resonator portions and a plurality of the parallel-arm resonator portions.

6. The acoustic wave filter device according to claim 1, wherein the one or more remaining acoustic wave resonators of the plurality of acoustic wave resonators all include the second IDT electrode.

7. The acoustic wave filter device according to claim 1, further comprising a low-acoustic-velocity film between the high-acoustic-velocity member and the piezoelectric layer, in which an acoustic velocity of bulk waves propagating through the low-acoustic-velocity film is less than an acoustic velocity of bulk waves propagating through the piezoelectric layer; wherein
the low acoustic velocity film defines the plurality of acoustic wave resonators with the high-acoustic-velocity member, the piezoelectric layer, and the plurality of IDT electrodes.

8. The acoustic wave filter device according to claim 1, wherein the piezoelectric layer is made of 50° Y-cut angle LiTaO$_3$.

9. The acoustic wave filter device according to claim 1, wherein the low-acoustic-wave film is made of silicon oxide.

10. The acoustic wave filter device according to claim 1, wherein an inclination angle of the second IDT electrode is greater than or equal to about 0.4° and less than or equal to about 15°.

11. A multiplexer comprising:
an antenna terminal connected to an antenna;
the acoustic wave filter device according to claim 1, the acoustic wave filter device being connected to the antenna terminal; and
at least one band-pass filter commonly connected to the antenna terminal along with the acoustic wave filter device, and having a passband different from the acoustic wave filter device.

12. The multiplexer according to claim 11, wherein both of the acoustic wave resonator of the series-arm resonator portion closest to the antenna end and the acoustic wave resonator of the parallel-arm resonator portion closest to the antenna end include the first IDT electrode.

13. The multiplexer according to claim 11, wherein the high-acoustic-velocity member is a supporting substrate.

14. The multiplexer according to claim 11, wherein
the high-acoustic-velocity member is a high-acoustic-velocity film; and
a supporting substrate is arranged such that the high-acoustic-velocity film is between the supporting substrate and the piezoelectric layer.

15. The multiplexer according to claim 11, wherein the acoustic wave filter device is a ladder filter including a plurality of the series-arm resonator portions and a plurality of the parallel-arm resonator portions.

16. The multiplexer according to claim 11, wherein the one or more remaining acoustic wave resonators of the plurality of acoustic wave resonators all include the second IDT electrode.

17. The multiplexer according to claim 11, further comprising a low-acoustic-velocity film between the high-acoustic-velocity member and the piezoelectric layer, in which an acoustic velocity of bulk waves propagating through the low-acoustic-velocity film is less than an acoustic velocity of bulk waves propagating through the piezoelectric layer; wherein
- the low acoustic velocity film defines the plurality of acoustic wave resonators with the high-acoustic-velocity member, the piezoelectric layer, and the plurality of IDT electrodes.

18. The multiplexer according to claim 11, wherein the piezoelectric layer is made of 50° Y-cut angle $LiTaO_3$.

19. The multiplexer according to claim 11, wherein the low-acoustic-wave film is made of silicon oxide.

20. The multiplexer according to claim 11, wherein an inclination angle of the second IDT electrode is greater than or equal to about 0.4° and less than or equal to about 15°.

* * * * *